United States Patent
Ozasa et al.

(10) Patent No.: US 7,405,636 B2
(45) Date of Patent: Jul. 29, 2008

(54) PASSIVE POLYPHASE FILTER

(75) Inventors: Masayuki Ozasa, Kyoto (JP); Akio Yokoyama, Osaka (JP); Manabu Ookubo, Shiga (JP); Takao Soramoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 304 days.

(21) Appl. No.: 11/409,764

(22) Filed: Apr. 24, 2006

(65) Prior Publication Data

US 2006/0244551 A1    Nov. 2, 2006

(30) Foreign Application Priority Data

Apr. 28, 2005   (JP)   ............................. 2005-132558
May 12, 2005   (JP)   ............................. 2005-139936

(51) Int. Cl.
*H03H 7/06* (2006.01)
*H01L 21/822* (2006.01)

(52) U.S. Cl. ...................... 333/172; 455/307
(58) Field of Classification Search ................. 333/167, 333/168, 172; 455/307
See application file for complete search history.

(56) References Cited

U.S. PATENT DOCUMENTS 7,078,986 B2 *  7/2006  Yang .......................... 333/172

7,190,942 B1 *  3/2007  Nise .......................... 455/307

FOREIGN PATENT DOCUMENTS

JP           2003-234406           8/2003

OTHER PUBLICATIONS

Behbahani et al., "CMOS Mixers and Polyphase Filters for Large Image Rejection", IEEE Journal of Solid-State Circuit, vol. 36, No. 6, Jun. 2001, pp. 873-887.

* cited by examiner

*Primary Examiner*—Seungsook Ham
(74) *Attorney, Agent, or Firm*—Hamre, Schumann, Mueller & Larson, P.C.

(57) ABSTRACT

Four input nodes I1-I4 for inputting 4-phase signals, four resistors R1-R4, four capacitors C1-C4, and four output nodes O1-O4 for outputting 4-phase signals are provided. The resistors and the capacitors are connected alternately in a loop, and the input nodes and output nodes are connected alternately to the respective nodes between the resistors and the capacitors sequentially. Each of the four resistors is composed of a group of three or more partial resistors, and three groups of the partial resistors R2a-R2c, R3a-R3c and R4a-R4c are collected respectively and arranged in the same attitude, while the partial resistors R1a-R1c of the remaining group are distributed into the other groups and arranged in the same line the same attitude as the partial resistors of each of the other groups. The regions of the thus collected groups are arranged in one direction. By simplifying the layout of the components and the shape of the wirings, influences on the characteristics by the parasitic elements are reduced, and complication in the layout and wirings can be suppressed even when using plural stages.

19 Claims, 22 Drawing Sheets

PASSIVE POLYPHASE FILTER

BACKGROUND OF THE INVENTION

1. Field of the Invention

The present invention relates to a passive polyphase filter (complex filter) used for image rejection or the like in signal processing in electronic equipment, and particularly, the present invention relates to the improvement in a layout of components such as resistors, capacitors and input/output nodes.

2. Description of Related Art

A passive polyphase filter used for image rejection in signal processing in electronic equipment has a circuit structure as shown in FIG. 20 in the case of a 4-phase input, for example. The passive polyphase filter in FIG. 20 is configured by connecting resistors R1, R2, R3, R4 and capacitors C1, C2, C3, C4 in a loop. I1, I2, I3 and I4 are input nodes through which signals are inputted, and O1, O2, O3 and O4 are output nodes through which signals are outputted. The resistors R1-R4 have the same resistance value, and the capacitors C1-C4 have the same capacitance value.

In the circuit in FIG. 20, as a signal processing from the input node I1 to the output node O1, a passive primary low-pass filter is configured by the resistor R1 and the capacitor C4, while as a signal processing from the output node O2 to the input node I1, a passive primary high-pass filter is configured by the capacitor C1 and the resistor R1. Namely, an inherent input signal and a signal from the output node O2 are synthesized at the input node I1 and the thus synthesized signal is outputted to the output node O1. The relationships of signals from the other signal input nodes to the output nodes are similar.

FIG. 21 is a plan view showing an example of a layout of the above-mentioned passive polyphase filter on an integrated circuit. The respective reference numerals are applied corresponding to the circuit diagram of FIG. 20. In this conventional layout of a passive polyphase filter, wirings 102-104 are made to meander in order to adjust the wiring resistance to be equal to that of the wiring 101 (see, for example, "IEEE JOURNAL OF SOLID-STATE CIRCUIT, VOL. 36, No. 6, JUNE 2001, CMOS Mixers and Polyphase Filters for Large Image Rejection, Farbod Behbahani et al.").

FIG. 22 is a plan view showing a layout disclosed in JP 2003-234406 A (p. 7, FIG. 1) as another example of a conventional passive polyphase filter. In the layout of the conventional passive polyphase filter, the input node I1 and the input node I4 are shared, and also the input node I2 and the input node I3 are shared to provide a layout on an integrated circuit for a 2-phase input. The resistors R1-R4 and the capacitors C1-C4 have a 90-degree rotational symmetry, and the resistors and the capacitors are arranged alternately to reduce the occurrence of parasitic capacitors.

Conventionally in a layout of a passive polyphase filter used for image rejection in signal processing in electronic equipment, there have been some objects when providing the passive polyphase filter on an integrated circuit. Specifically, it is required to simplify the layout of plural stages, reduce influences on the characteristics by a parasitic element caused by the layout, and equalize the influences.

Therefore, for the case of a 4-phase input passive polyphase filter as shown in FIG. 21, wirings 102-104 are made to meander to match the values of the wiring resistance as a parasitic element caused by the wiring 101 connecting the resistor R1 and the capacitor C1, the wiring 102 connecting the resistor R2 and the capacitor C2, the wiring 103 connecting the resistor R3 and the capacitor C3, and the wiring 104 connecting the resistor R4 and the capacitor C4. As a result, the layout of the passive polyphase filter becomes complicated.

FIG. 23 is a circuit diagram showing a 2-stage 4-phase input passive polyphase filter. As an example of a layout of this passive polyphase filter on an integrated circuit, FIG. 24 shows a layout configured on the basis of the method as shown in FIG. 21. In this layout, for connecting the output nodes of the first stage and the input nodes of the second stage in the respective phases, a wiring 106 connecting the output O12 of the first stage and the input I22 of the second stage, a wiring 107 connecting the output O13 and the input I23, and a wiring 108 connecting the output O14 and the input I24 must be crossed with respect to a wiring 105 connecting the resistor R21 and the capacitor C21. This creates a wiring capacitor as a parasitic element whose value will change the filter characteristics.

In a layout of a 4-phase input passive polyphase filter as shown in FIG. 22, a relative variation is differentiated due to the difference in the directions between the resistors R1 and R3, and the resistors R4 and R2, and thus it is difficult to obtain the same resistance value. In addition to that, when the 2-stage 4-phase input passive polyphase filter as shown in FIG. 23 is configured on the basis of the layout manner in FIG. 22, the configuration will be complicated considerably as shown in FIG. 25.

SUMMARY OF THE INVENTION

Therefore, with the foregoing in mind, it is an object of the present invention to provide a passive polyphase filter having a simple component layout and wiring shape, so that a complication of the layout and the wirings is suppressed even when the passive polyphase filter has a configuration of plural stages, thereby reducing the influence on the characteristics by a parasitic element caused by the layout of the respective components.

Another object of the present invention is to provide a passive polyphase filter that easily can be equalized in the characteristic influences from the parasitic element due to the layout of the components.

A passive polyphase filter having a first configuration according to the present invention includes input nodes of m in number for inputting m-phase signals, resistors of m in number, capacitors of m in number, and output nodes of m in number for outputting m-phase signals, formed on the same board of an integrated circuit where m denotes an integer not less than 3. The resistors and the capacitors are connected alternately in a loop, and the input nodes and the output nodes are connected alternately in that order to the respective nodes between the resistors and the capacitors. For achieving the object, each of the resistors of m in number is composed of a group of partial resistors of (m-1) in number. Among the partial resistors of the group of m in number, the partial resistors of (m-1) of the groups are arranged collectively in the same attitude for each group, and partial resistors of the remaining one group are distributed into the respective groups and arranged in the same line and the same attitude as the partial resistors of each of the other groups, and the regions of the thus collected groups are arranged in one direction.

A passive polyphase filter having a second configuration according to the present invention has a basic configuration of four resistors, four capacitors, four input nodes for inputting 4-phase signals, and four output nodes for outputting 4-phase signals, which are formed on the same board of an integrated circuit. The resistors and the capacitors are connected alternately in a loop, and the input nodes and the output nodes are connected alternately in that order to the respective nodes between the resistors and the capacitors. For achieving the above-mentioned object, the input nodes and the output nodes are arranged collectively in a central region, the four resistors are arranged in a region surrounding the input nodes and the output nodes, and the four capacitors are arranged in a region surrounding the four resistors. The four resistors and the four capacitors are covered with a wiring layer as an upper layer formed of a uniform conductive layer.

A passive polyphase filter having a third configuration according to the present invention has a basic configuration similar to that of the second passive polyphase filter. The input nodes and the output nodes are arranged collectively in a central region, the four capacitors are arranged in a region surrounding the input nodes and the output nodes, and the four resistors are arranged in a region surrounding the four capacitors. The four resistors and the four capacitors are covered with a wiring layer as an upper layer formed of a uniform conductive layer.

DETAILED DESCRIPTION OF THE INVENTION

Figure 1:
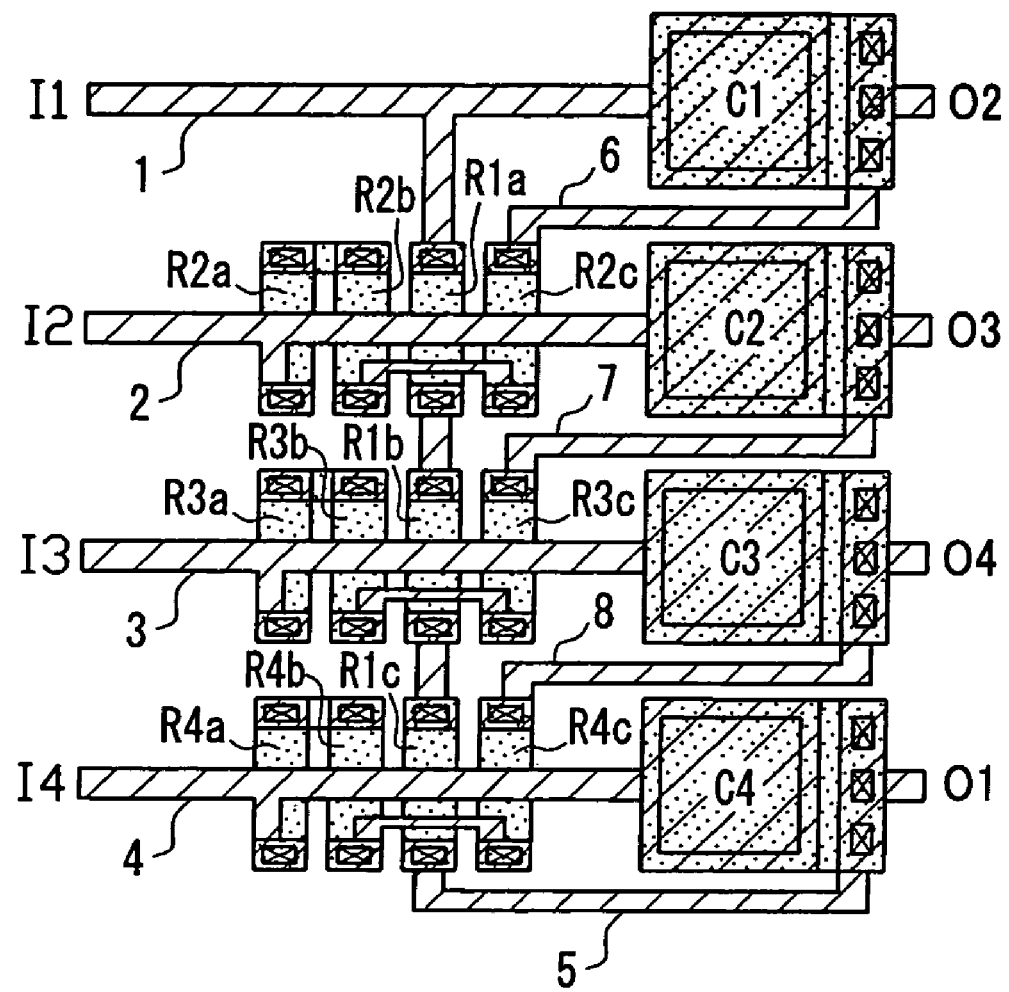
FIG. 1 is a plan view showing a layout of a 4-phase input passive polyphase filter according to a first embodiment of the present invention.

According to the passive polyphase filter having the first configuration, a layout of the resistors and the capacitors as components and also a configuration of wirings between the components and the input/output nodes are made simple, and the layout and the wirings will not be complicated even when the filter has a configuration of plural stages. Thus influences on the characteristics by a parasitic element created by the layout of the respective components can be reduced.

The passive polyphase filter having the first configuration of the present invention can have m=4.

It is preferable in the configuration that the capacitors of m in number, and the input nodes of m in number and the output nodes of m in number are arranged in parallel to the arrangement direction of the respective groups of the partial resistors in line with the respective groups of the partial resistors.

It is preferable in this configuration that the capacitors of m in number are arranged adjacent to the respective groups of the partial resistors, and the input nodes of m in number are arranged in one of the outside regions interposing a region that contains the respective groups of the partial resistors and the capacitors of m in number, while the output nodes of m in number are arranged in the other outside region.

It is also preferable that the partial resistors in each of the groups are arranged with the sides being adjacent to each other in a direction perpendicular to the arrangement direction of the group.

It is also preferable that the capacitors and the input/output nodes are connected to each other through wirings traversing the groups of the partial resistors.

In the passive polyphase filter having the second or third configuration, a layout of the resistors and the capacitors as the components and also a configuration of wirings between the components and the input/output nodes are made simple, and the layout and the wiring will not be complicated even if the filter has a configuration of plural stages, and thus influences on the characteristics by the parasitic element can be equalized.

In the passive polyphase filter having the second or third configuration, each of the four resistors is divided into two parts, and the thus divided partial resistors are arranged along directions perpendicular to each other.

It is possible to prepare plural stages of the passive polyphase filters having any of the above mentioned configurations where the input nodes of the passive polyphase filter of the former stage are connected respectively to corresponding output nodes of the passive polyphase filters of the latter stage so as to configure a passive polyphase filter.

It is also possible to configure an integrated circuit including a passive polyphase filter having any of the above-mentioned configurations. It is also possible to configure a receiver including the integrated circuit.

Embodiments of the present invention will be described below with reference to the attached figures.

FIRST EMBODIMENT

Figure 21:
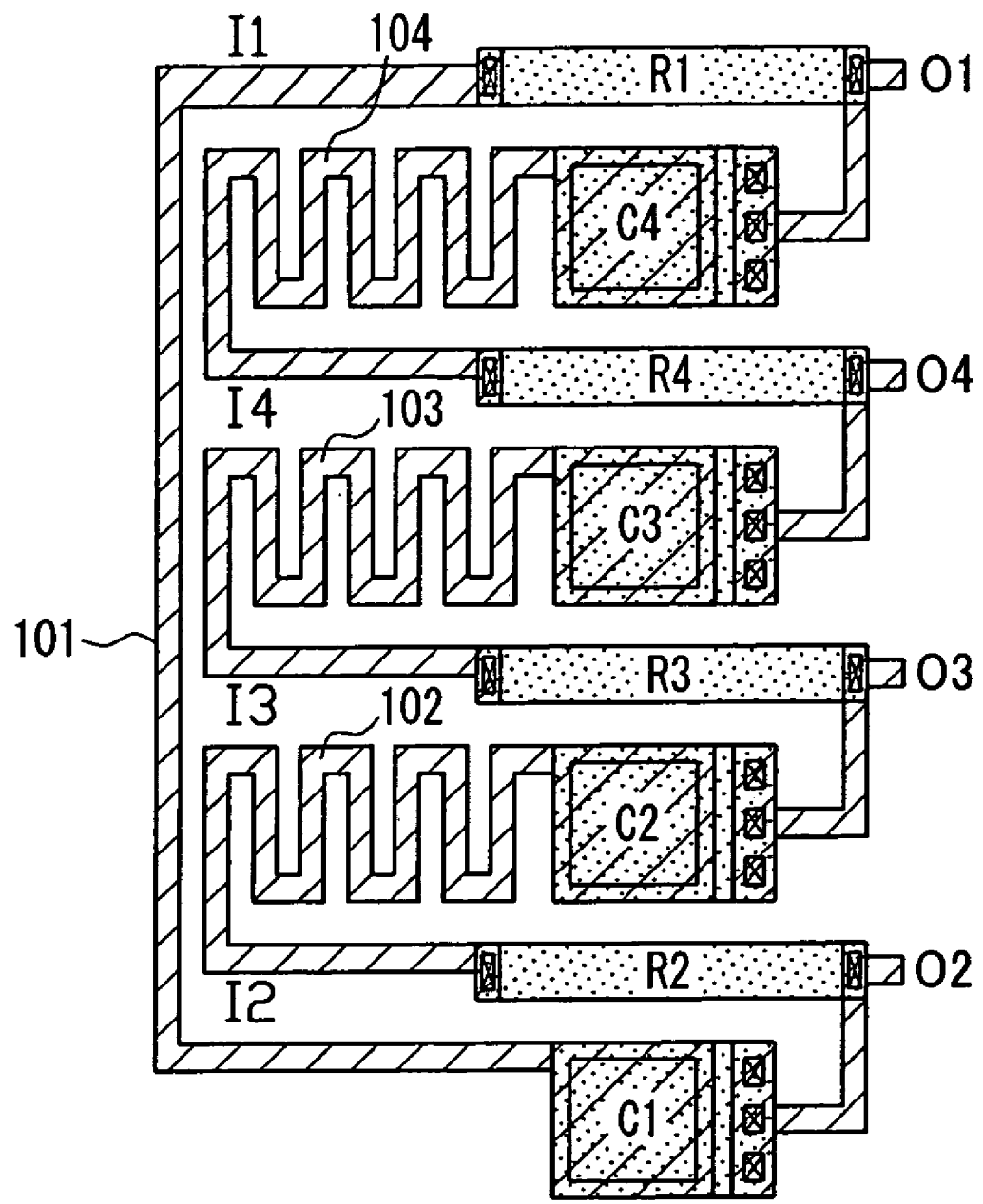
FIG. 21 is a plan view showing a layout of a 4-phase input passive polyphase filter according to a conventional example.
Figure 22:
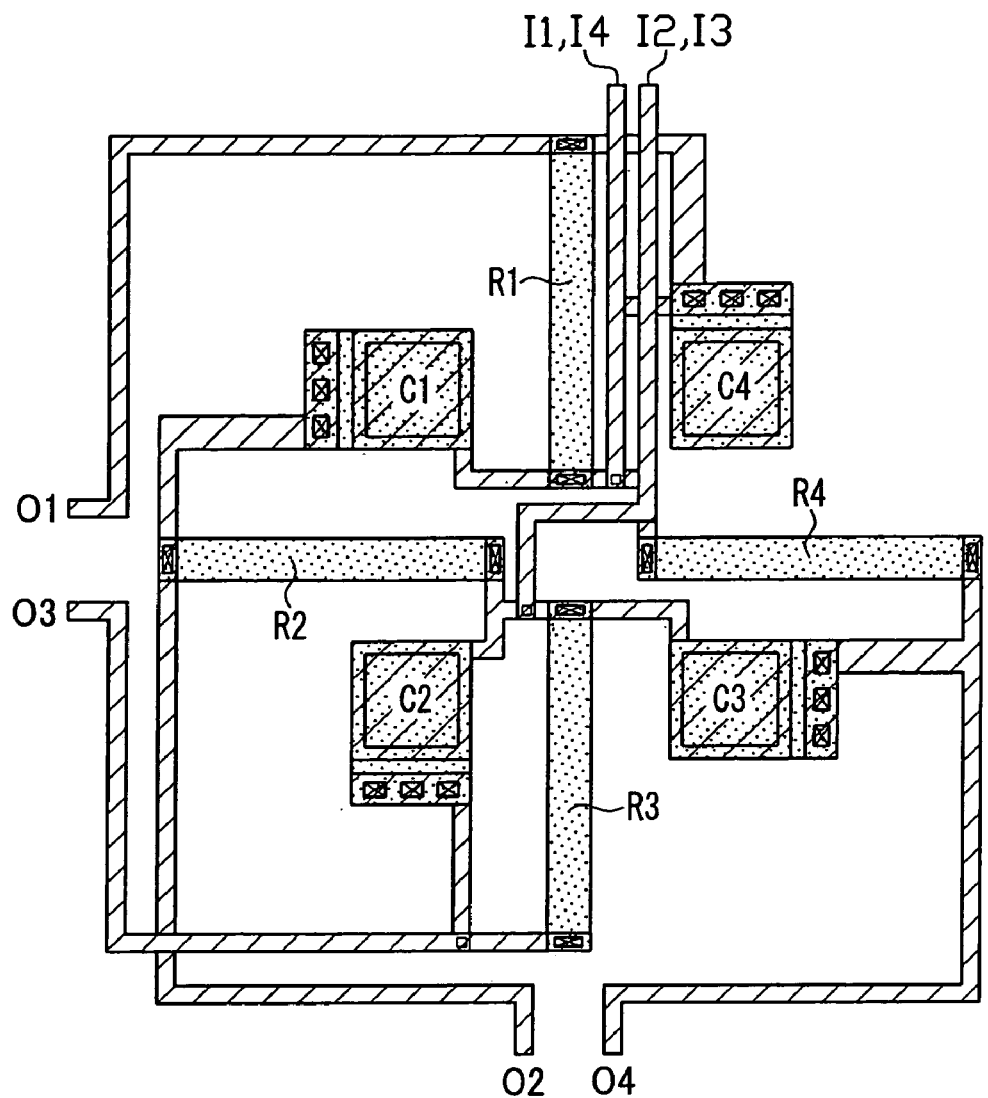
FIG. 22 is a plan view showing a layout of a 4-phase input passive polyphase filter according to another conventional example.

FIG. 1 is a plan view showing a layout of a passive polyphase filter according to a first embodiment. This layout configures a 4-phase input passive polyphase filter having the circuit structure of FIG. 20. In the explanation, components identical to those in the conventional examples as shown in FIGS. 21, 22 or the like will be assigned with the same reference numerals.

Figure 20:
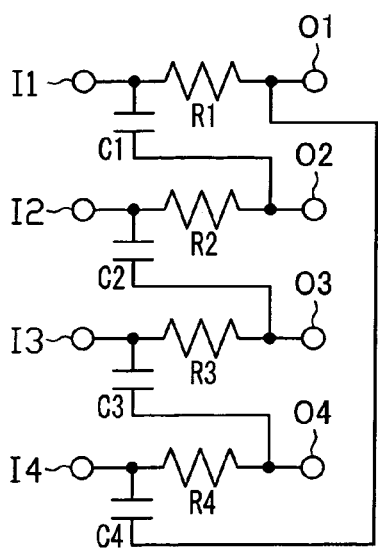
FIG. 20 is a circuit diagram of a 4-phase input passive polyphase filter.

In the layout of FIG. 1, each of the resistors R1-R4 of FIG. 20 is divided into three parts and configured as a group of partial resistors. That is, the resistor R1 is composed of a group of partial resistors R1a-R1c, the resistor R2 is composed of a group of partial resistors R2a-R2c, the resistor R3 is composed of a group of partial resistors R3a-R3c, and the resistor R4 is composed of a group of partial resistors R4a-R4c. As clarified in the following embodiments, in the present invention, each of the resistors of m in number is divided into and configured as partial resistors of at least (m-1) in number. In the explanation below, the groups of the respective partial resistors are referred to generally as resistors R1-R4, though not denoted in the figure.

For the resistors R2-R4 other than the resistor R1, partial resistors R2a-R2c, partial resistors R3a-R3c and partial resistors R4a-R4c are arranged collectively for the respective groups. The regions of the thus collected groups of each of the resistors R2-R4 are aligned in one direction. That is, in the embodiment as shown in FIG. 1, the respective groups of the partial resistors composing the resistors R2-R4 are aligned vertically. The partial resistors R2a-R2c, the partial resistors R3a-R3c, and the partial resistors R4a-R4c are arranged in the same attitude. For example, the partial resistors R2a-R2c are arranged horizontally in a direction perpendicular to the vertical direction that is the arrangement direction of the respective groups, with the sides being adjacent to each other. The partial resistors R1a-R1c composing the resistor R1 are distributed into the other groups and arranged in the same line and the same attitude as the partial resistors composing each of the other groups. That is, the partial resistor R1a the partial R1b and the partial resistor R1c are arranged in line with the partial resistors of the respective groups of R2, R3 and R4.

Capacitors C1-C4 are arranged adjacent to the respective groups of the partial resistors composing the resistors R2-R4. Input nodes I1-I4 are arranged in the left outer region and output nodes O1-O4 are arranged in the right outer region with respect to the region including the respective groups of the partial resistors and the capacitors C1-C4. In this manner, the capacitors C1-C4, the input nodes I1-I4, and the output nodes O1-O4 are arranged in parallel to the arrangement directions of the respective groups of the partial resistors composing the resistors R2-R4 in line with the respective groups of the partial resistors. Respective wirings 1-4 connecting the input nodes I1-I4 and the capacitors C1-C4 extends in a horizontal direction, and the wirings are arranged to traverse the groups of the partial resistors.

In this layout, a wiring 5 to connect the resistor R1 and the capacitor C4 can be shortened. As a result, there is no need to meander wirings 6-8 in order to match the respective wiring resistances by the wiring 6 connecting the resistor R2 and the capacitor C1, the wiring 7 connecting the resistor R3 and the capacitor C2, and the wiring 8 connecting the resistor R4 and the capacitor C3, to the wiring resistance by the wiring 5. Therefore, the layout of components for composing the passive polyphase filter has a plain and simple shape. Furthermore, the relative variation is reduced since the respective partial resistors are arranged in the same direction.

Figure 2:
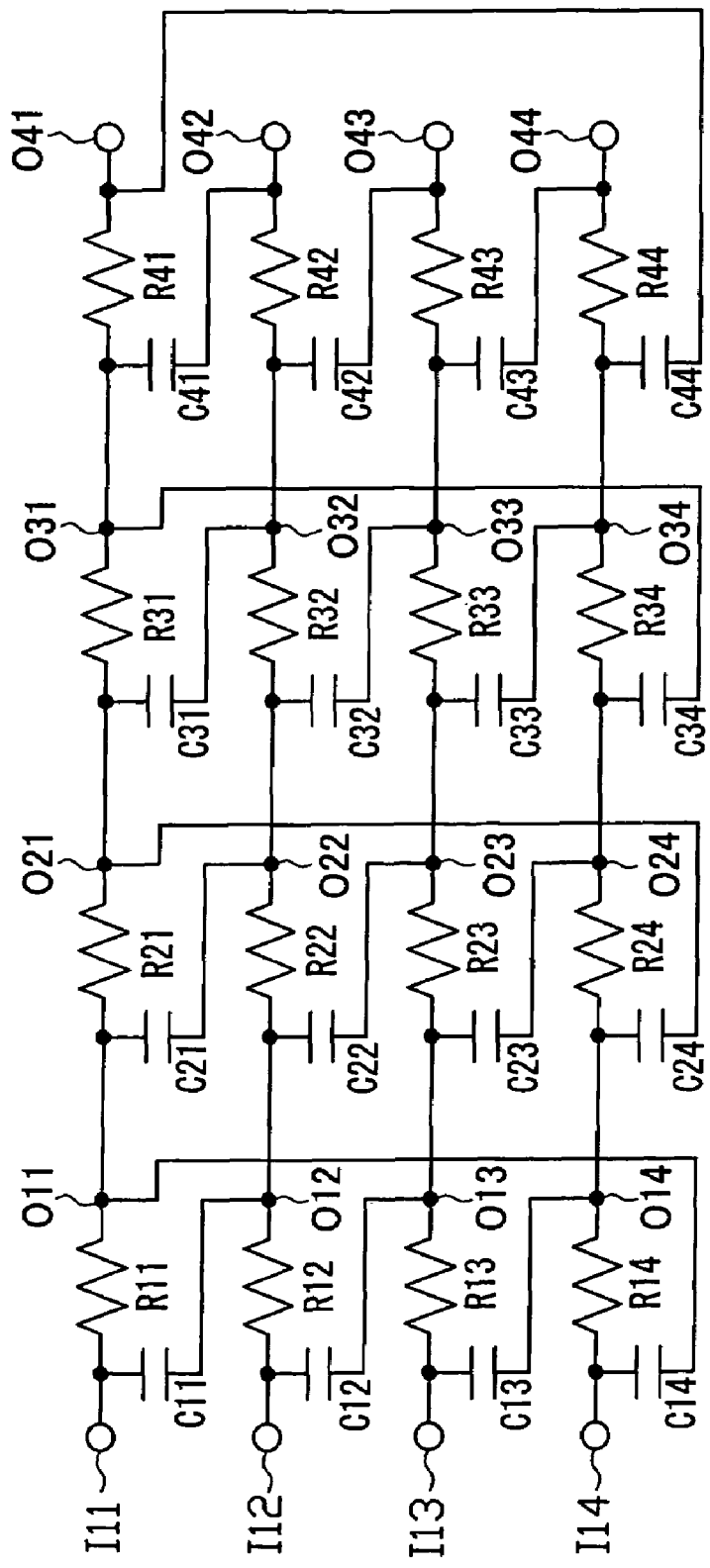
FIG. 2 is a circuit diagram of a 4-stage 4-phase input passive polyphase filter according to the first embodiment.

FIG. 2 is a circuit diagram of a 4-stage 4-phase input passive polyphase filter as an example where the above-mentioned configuration is applied. With respect to a first stage filter including resistors R11-R14 and capacitors C11-C14, a second stage filter including resistors R21-24 and capacitors C21-C24 is connected at output nodes O11-O14 of the first stage filter. In the same manner, a third stage filter including resistors R31-34 and capacitors C31-C34 is connected at output nodes O21-O24 of the second stage filter, and a fourth stage filter including resistors R41-R44 and capacitors C41-C44 is connected at output nodes O31-O34 of the third stage filter.

Figure 3:
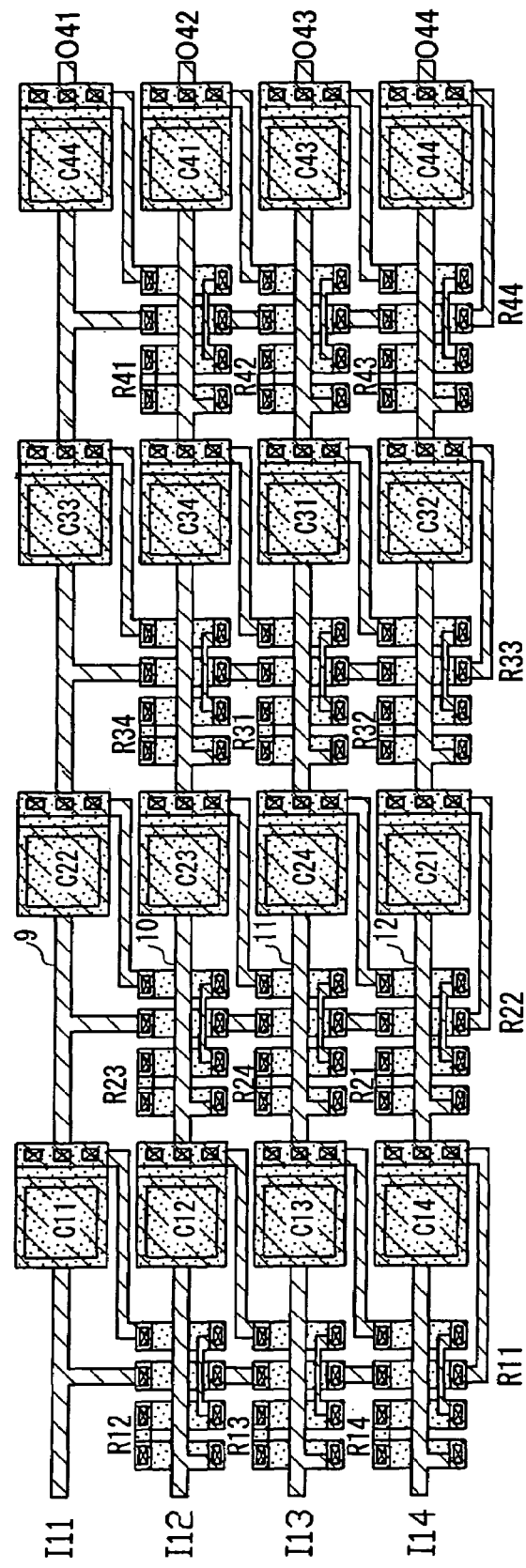
FIG. 3 is a plan view showing a layout of the 4-stage 4-phase input passive polyphase filter.

When the layout according to the present embodiment is applied to the 4-stage 4-phase input passive polyphase filter as shown in FIG. 2, the configuration as shown in FIG. 3 is provided. That is, the filter of each stage has a configuration as shown in FIG. 1. The filters of the respective stages are aligned in the transverse direction, and the respective input nodes and output nodes are connected to each other.

Figure 24:
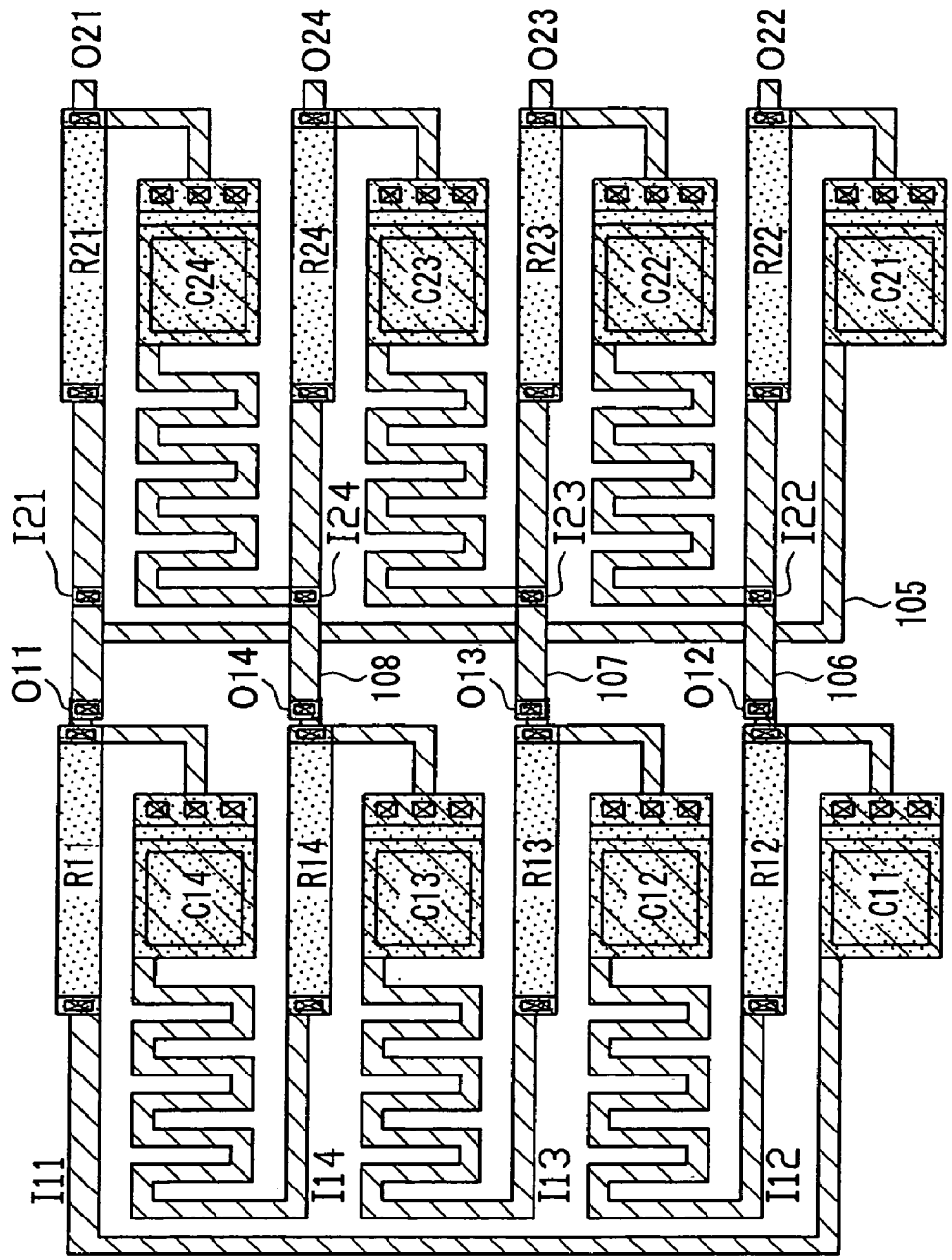
FIG. 24 a plan view showing a layout of a 2-stage 4-phase input passive polyphase filter according to a conventional example.
Figure 25:
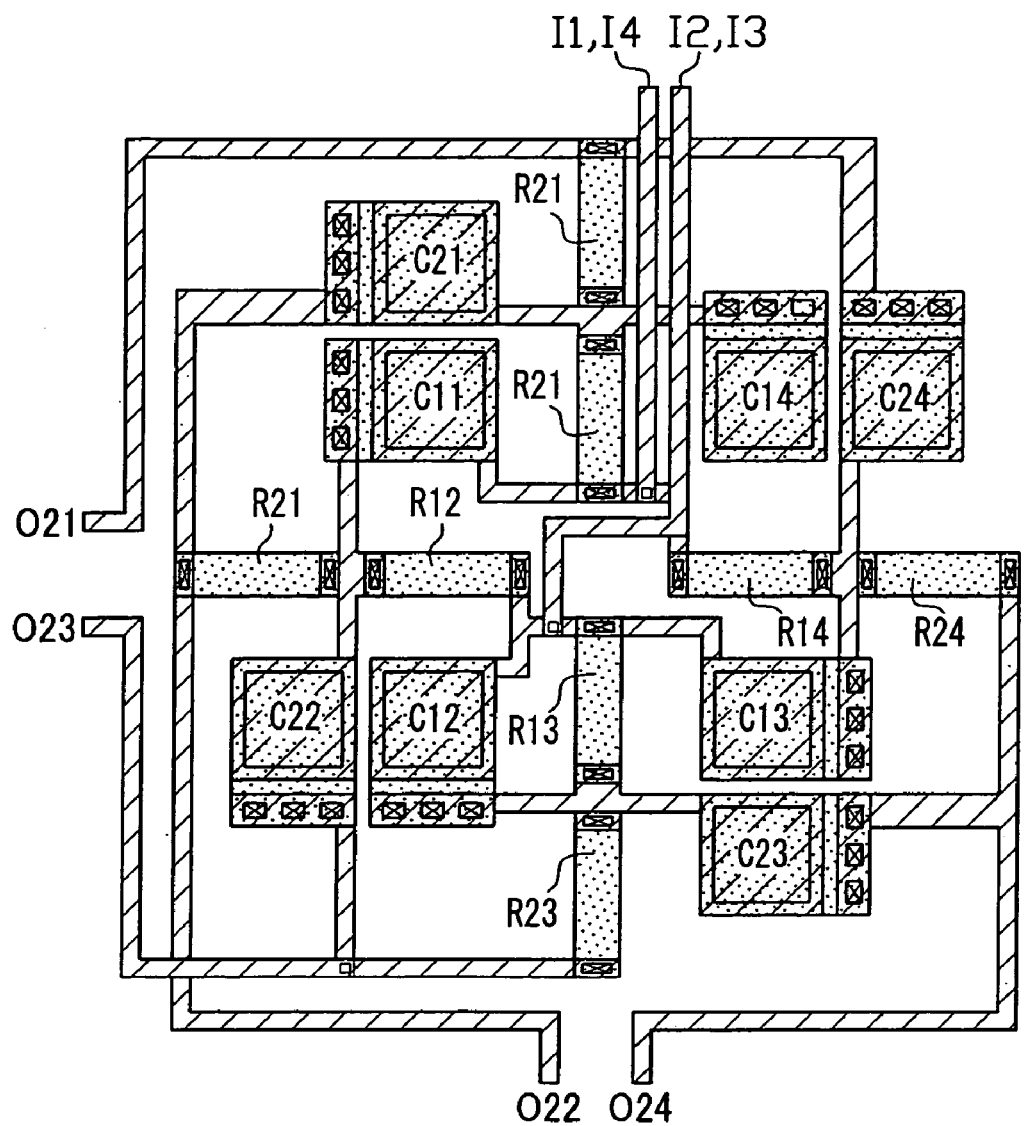
FIG. 25 is a plan view showing a layout of a 2-stage 4-phase input passive polyphase filter according to another conventional example.

Unlike the conventional example as shown in FIG. 24, according to this embodiment including wirings 9-12 between the output nodes of the first stage and the input nodes of the second stage, for example, the wiring 12 connecting the resistor R21 and the capacitor C21 of the second stage does not cross the wiring 11 and the like connecting the output of the first stage and the input of the second stage. Since the wirings do not cross each other, the occurrence of a wiring capacitor as a parasitic element is suppressed, and thus a change in the filter characteristics is suppressed. For the wirings of the latter stages, the occurrence of an unfavorable wiring capacitor is suppressed similarly.

As mentioned above, according to the first embodiment, the layout of the components is simplified, and the thus obtained passive polyphase filter is excellent, and influences on the characteristics by a parasitic element caused by the layout are reduced. The effects of suppressing the complication in the component layout and wirings can be improved particularly in the case of a configuration with plural stages.

Figure 4:
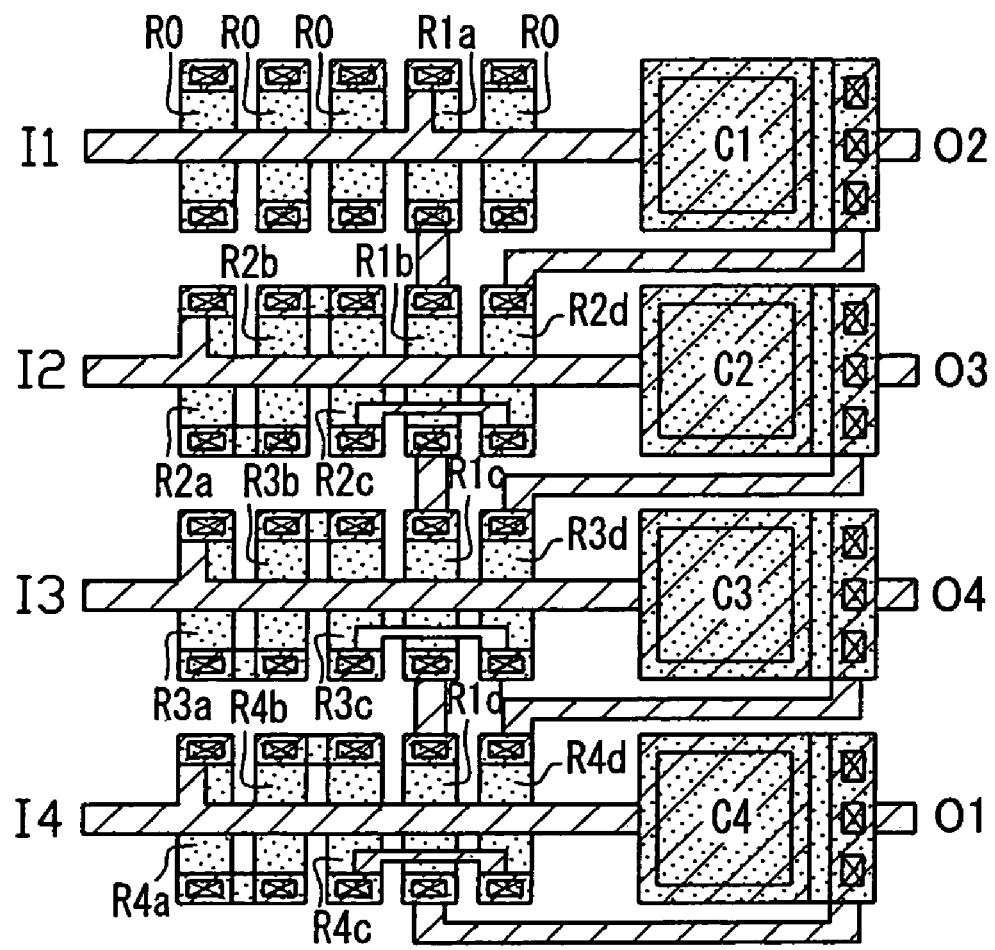
FIG. 4 is a plan view showing another layout of the 4-stage 4-phase input passive polyphase filter.

In the above example, each of the resistors is divided into three parts. FIG. 4 is a plan view showing an embodiment where each of the resistors is divided into four parts. In this example, a partial resistor R1a is arranged additionally in a region adjacent to the capacitor C1. In line with the partial resistor R1a four dummy partial resistors R0 are arranged as well. The partial resistors R0 are provided in order to adjust the balance with the other resistor groups, thereby reducing the relative variation.

Figure 5:
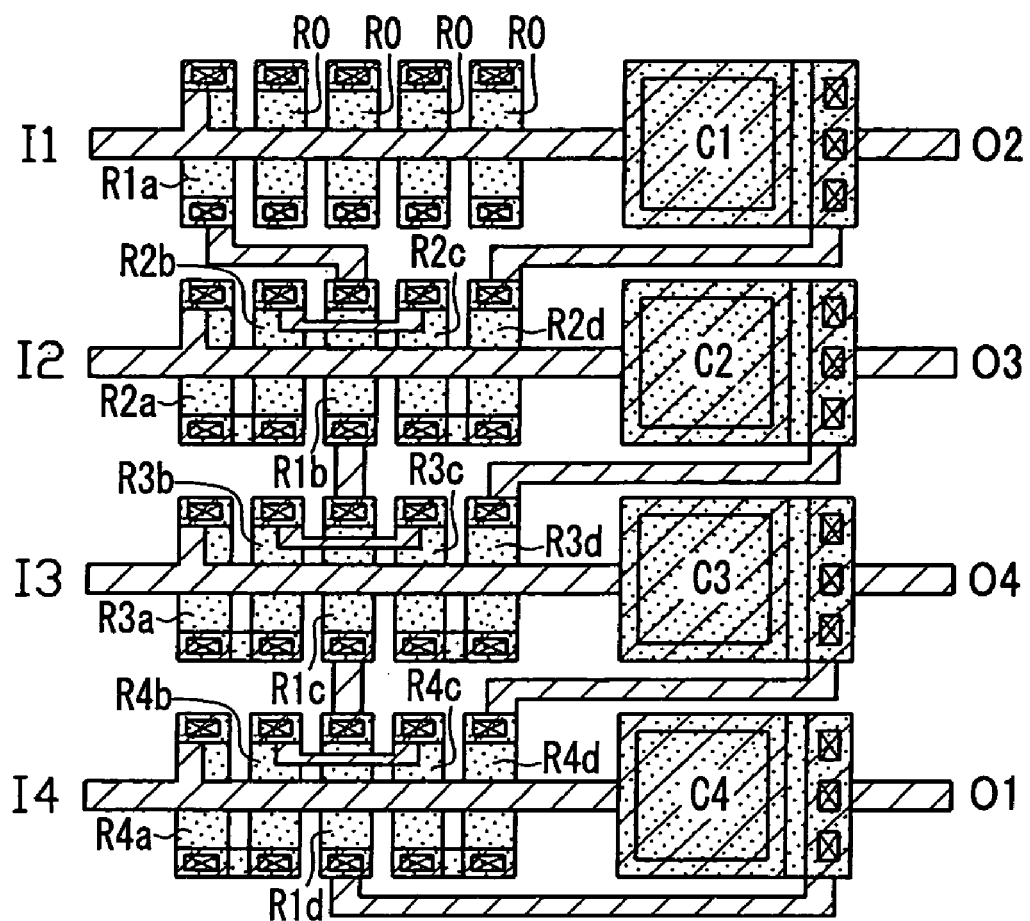
FIG. 5 is a plan view showing still another layout of the 4-stage 4-phase input passive polyphase filter.

FIG. 5 is a plan view showing an embodiment of a passive polyphase filter where the values of wiring resistances due to the wirings between the divided resistors and also wirings from the input nodes I1-I4 to the capacitors C1-C4 are adjusted to be equal.

In the example according to this embodiment where plural stages of passive polyphase filters are connected, the passive polyphase filters have the same resistors and capacitors as shown in FIG. 3. However, the resistors and the capacitors can be varied in accordance with the required characteristics.

Though the above description refers to an example for configuration using a single layer wiring, the upper wiring can be configured with a multilayer wiring in order to reduce parasitic capacitors relating to a resistor-forming layer.

SECOND EMBODIMENT

Figure 6:
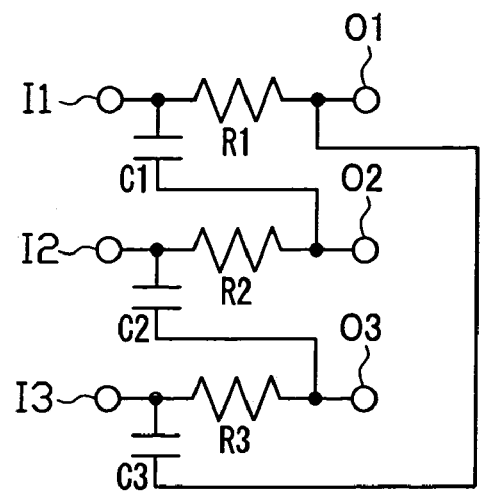
FIG. 6 is a circuit diagram of a 3-phase input passive polyphase filter according to a second embodiment of the present invention.
Figure 7:
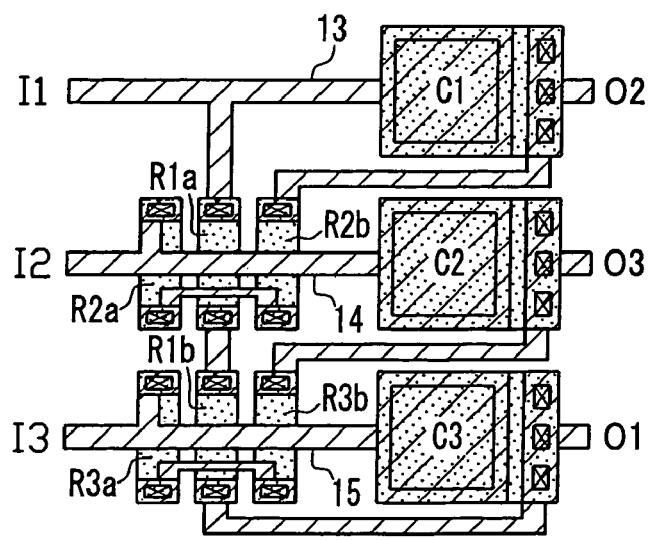
FIG. 7 is a plan view showing a layout of the 3-phase input passive polyphase filter.

FIG. 6 is a circuit diagram of a 3-phase input passive polyphase filter in a second embodiment. Resistors R1-R3 and capacitors C1-C3 are connected in a loop, to which input nodes I1-I3 and output nodes O1-O3 are provided. FIG. 7 is a plan view showing a layout of the respective components of the 3-phase input passive polyphase filter shown in FIG. 6. The circuit structure and the layout of the respective components are the same substantially as those in the first embodiment, and thus the same reference numerals are assigned to the same components in order to avoid the duplicate explanation.

Each of the resistors R1-R3 in FIG. 6 is divided into two parts and composed as a group of partial resistors as in FIG. 7. The resistor R1 is composed of a group of partial resistors R1a-R1b, the resistor R2 is composed of a group of partial resistors R2a-R2b, and the resistor R3 is composed of a group of partial resistors R3a-R3b. For the resistors R2-R3, the partial resistors R2a-R2b and the partial resistors R3a-R3b of the respective groups are arranged collectively for the respective groups. The partial resistors R2a-R2b and the partial resistors R3a-R3b are arranged in the same attitude. The partial resistors R1a-R1b composing the resistor R1 are distributed into the other groups and arranged in the same line and the same attitude as the partial resistors of each of the other groups. That is, the partial resistor R1a and the partial resistor R1b are arranged in line with the partial resistors of the group of the resistor R2 and the group of the resistor R3 respectively.

A wiring 14 connects the resistor R2 and the capacitor C2, and a wiring 15 connects the resistor R3 and the capacitor C3. Since a wiring 13 connecting the resistor R1 and the capacitor C1 can be shortened in the above-mentioned layout, there is no need to meander the wirings 14 and 15 in order to match the wiring resistance values of the wirings. As a result, the layout of components composing the passive polyphase filter has a plain and simple shape. Furthermore, the relative variation is reduced as the respective partial resistors are arranged in the same direction.

Figure 8:
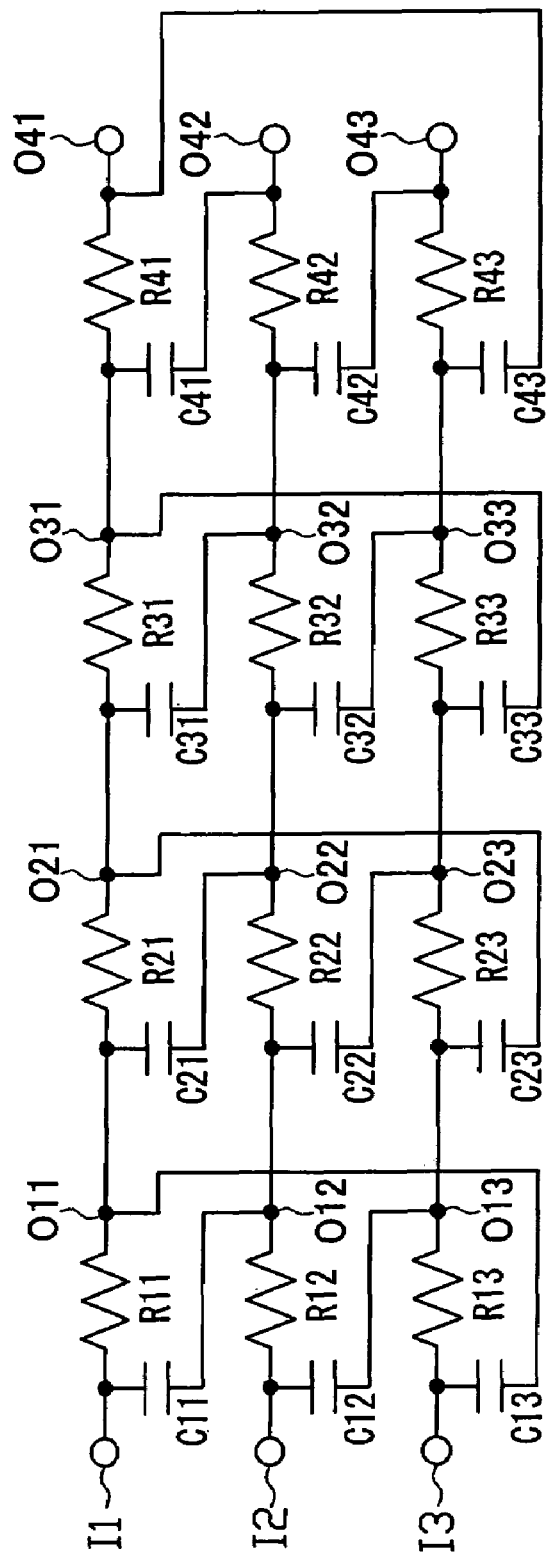
FIG. 8 is a circuit diagram of a 4-stage 3-phase input passive polyphase filter according to the second embodiment.
Figure 9:
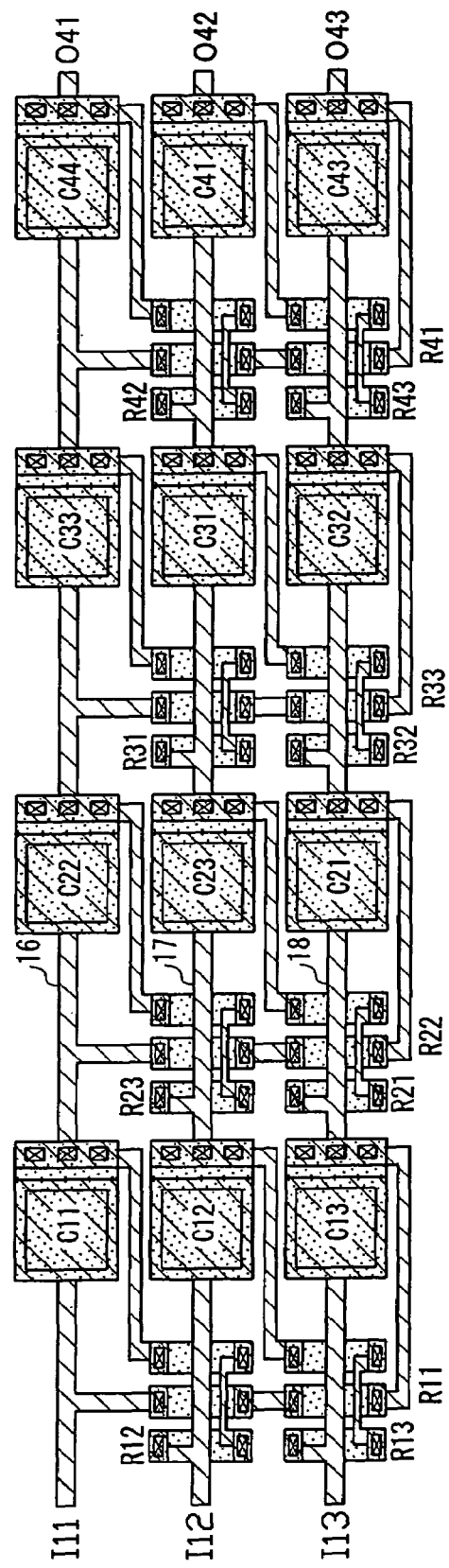
FIG. 9 is a plan view showing the 4-stage 3-phase input passive polyphase filter.

As an application example of the above-mentioned embodiment, FIG. 8 is a circuit diagram of a 4-stage 3-phase input passive polyphase filter. With respect to a first stage filter including resistors R11-R13 and capacitors C11-C13, a second stage filter including resistors R21-R23 and capacitors C21-C23 is connected at the output nodes O11-O13 of the first stage filter. In the same manner, a third stage filter including resistors R31-R33 and capacitors C31-C33 is connected at the output nodes O21-O23 of the second stage filter, and a fourth stage filter including resistors R41-R43 and capacitors C41-C43 is connected at the output nodes O31-O33 of the third stage filter With respect to the 4-stage 3-phase input passive polyphase filter as shown in FIG. 8, the layout according to the embodiment can be applied to provide a configuration as shown in FIG. 9. That is, the filter of each the stages has a structure as shown in FIG. 7. The filters of the respective stages are aligned in the transverse direction, and the respective input nodes and the output nodes are connected to each other.

Unlike the conventional example as shown in FIG. 24, according to the alignment and wirings including wirings 16-18 between the output nodes of the first stage and the input nodes of the second stage, for example, the wiring 18 connecting the resistor R21 and the capacitor C21 of the second stage does not cross the wirings 16, 17 and the like connecting the output nodes of the first stage and the input nodes of the second stage. Since there is no crossing of the wirings, a wiring capacitor as a parasitic element is suppressed, and thus the change in the filter characteristics is suppressed. For the wirings of the latter stages, the occurrence of an unfavorable wiring capacitor is suppressed similarly.

THIRD EMBODIMENT

Figure 10:
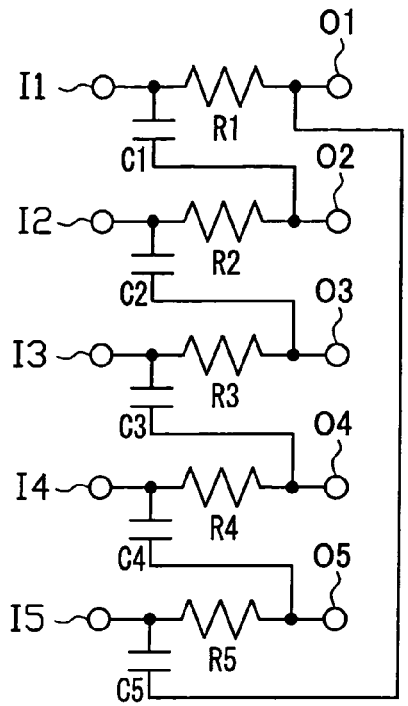
FIG. 10 is a circuit diagram of a 5-phase input passive polyphase filter according to a third embodiment of the present invention.
Figure 11:
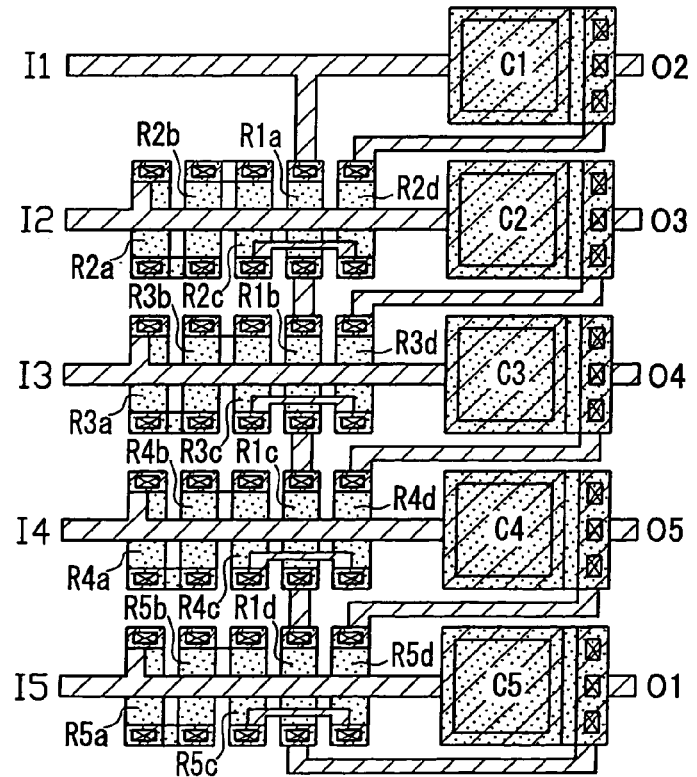
FIG. 11 is a plan view showing a layout of the 5-phase input passive polyphase filter.

FIG. 10 is a circuit diagram of a 5-phase input passive polyphase filter in a third embodiment. Resistors R1-R5 and capacitors C1-C5 are connected in a loop, to which input nodes I1-I5 and output nodes O1-O5 are provided. FIG. 11 is a plan view showing a layout of the respective components of the 5-phase input passive polyphase filter shown in FIG. 10. The circuit structure and a layout of the respective components are substantially the same as those in the first embodiment, and the same reference numerals are assigned to the same components in order to avoid the duplicate explanation.

Figure 12:
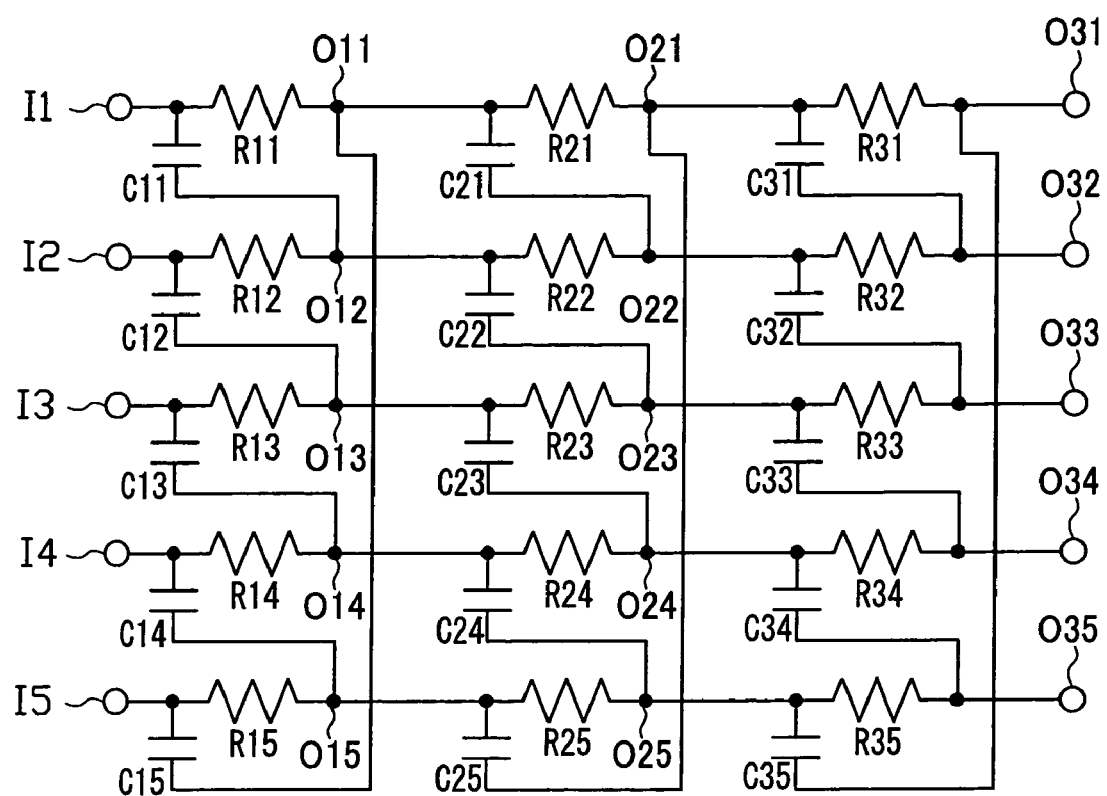
FIG. 12 is a circuit diagram of a 3-stage 5-phase input passive polyphase filter according to the third embodiment.

As an application example of the configuration in this embodiment, FIG. 12 shows a circuit diagram of a 3-stage 5-phase input passive polyphase filter. With respect to a first stage filter including resistors R11-R15 and capacitors C11-C15, a second stage filter including resistors R21-R25 and capacitors C21-C25 is connected at output nodes O11-O15 of the first stage filter. In the same manner, a third stage filter including resistors R31-R35 and capacitors C31-C35 is connected at output nodes O21-O25 of the second stage filter.

Figure 13:
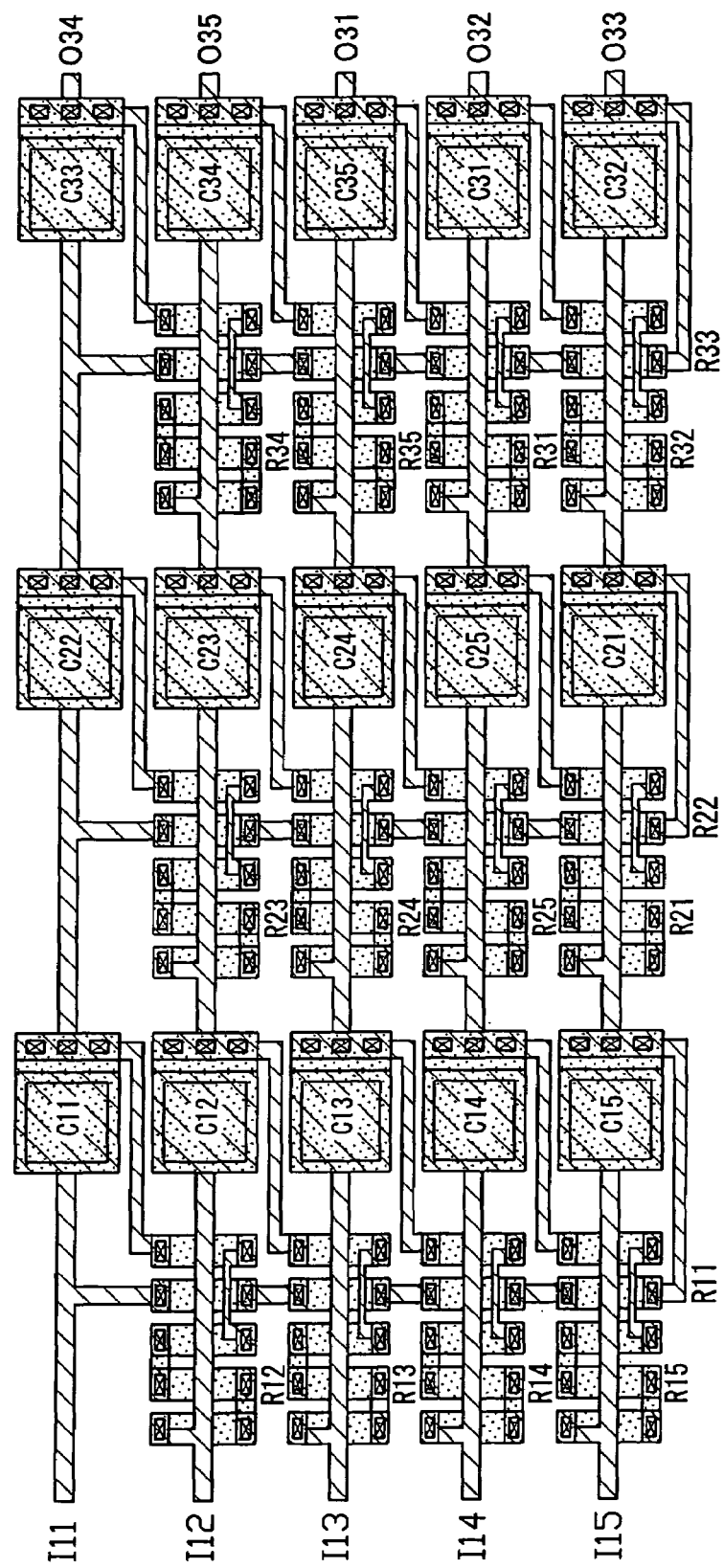
FIG. 13 is a plan view showing a layout of the 3-stage 5-phase input passive polyphase filter.

With respect to the 3-stage 5-phase input passive polyphase filter as shown in FIG. 12, the layout according to the embodiment can be applied to provide a configuration as shown in FIG. 13. That is, the filters of each of the stages have structures as shown in FIG. 11. The filters of the respective stages are aligned in the transverse direction, and the respective input nodes and the output nodes are connected to each other.

FOURTH EMBODIMENT

Figure 14:
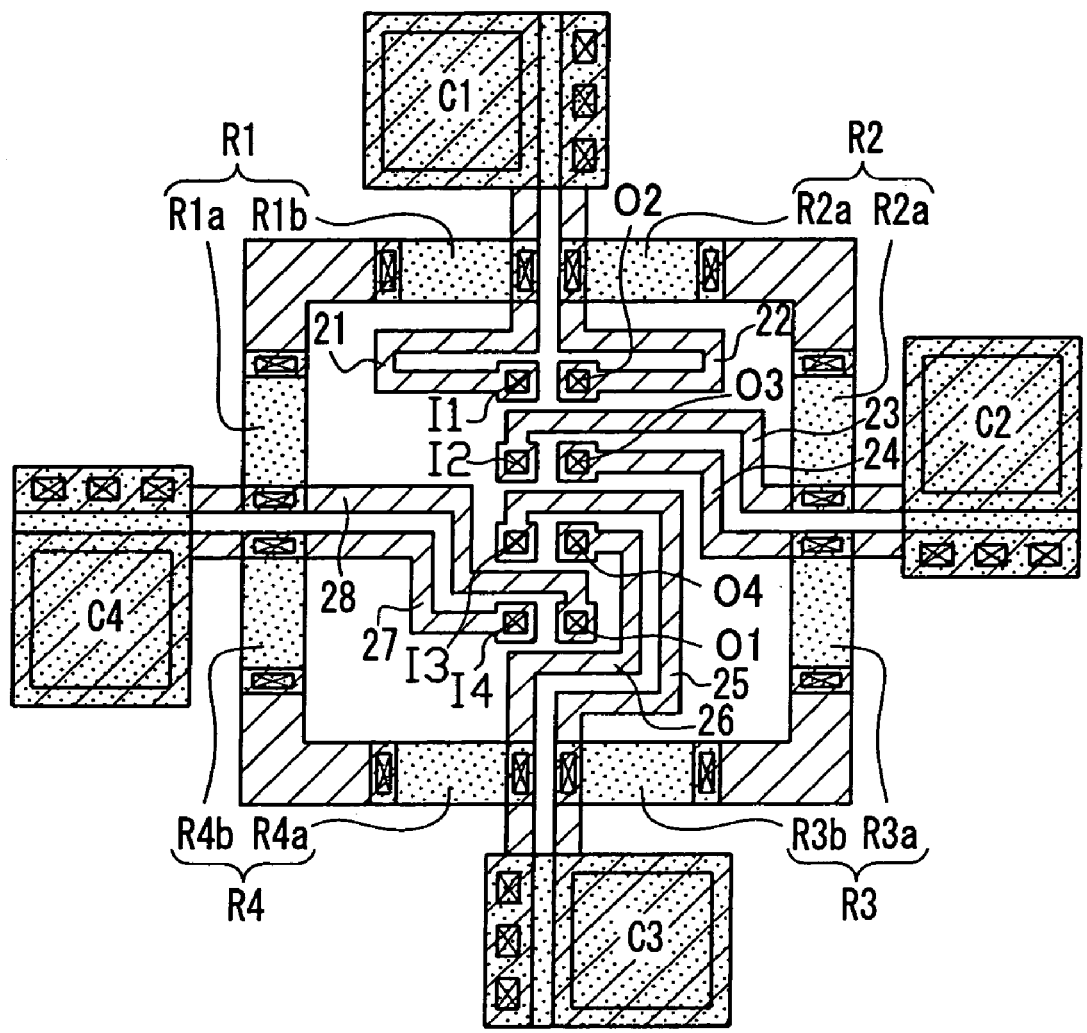
FIG. 14 is a plan view showing a layout of a 4-phase input passive polyphase filter according to a fourth embodiment of the present invention.

FIG. 14 is a plan view showing a layout of a passive polyphase filter according to a fourth embodiment. This layout realizes a 4-phase input passive polyphase filter having the circuit structure as in FIG. 20. The components identical to those in the conventional example as shown in FIGS. 21, 22 or the like are assigned with the same reference numerals for explanation.

The passive polyphase filter of FIG. 14 includes, on the same board of an integrated circuit, resistors R1-R4 having the same resistance value, capacitors C1-C4 having the same capacitance value, four input nodes I1-I4 for inputting 4-phase signals, and four output nodes O1-O4 for outputting 4-phase signals.

The input nodes I1-I4 and the output nodes O1-O4 are arranged collectively in the central region. In this embodiment, the input nodes I1-I4 are arranged in the left of the figure, and the output nodes O1-O4 are arranged in the right. The resistors R1-R4 are arranged clockwise in a region surrounding the input nodes I1-I4 and the output nodes O1-O4. The capacitors C1-C4 are arranged clockwise in a region surrounding the resistors R1-R4. Furthermore, each of the resistors R1-R4 is divided into two parts, so that the resistors are formed of partial resistors R1aR1b, partial resistors R2a, R2b, partial resistors R3a, R3b, and partial resistors R4a, R4b. The partial resistors R1aR1b forming the resistor R1 are arranged along directions perpendicular to each other. The remaining partial resistors forming the resistors R2-R4 are arranged in the similar manner.

The resistors R1-R4 and the capacitors C1-C4 are connected alternately in a loop. To the respective nodes between the resistors R1-R4 and the capacitors C1-C4 being connected to each other in a loop, the input nodes I1, I2, I3, I4, and the output nodes O1, O2, O3, O4 are connected alternately in that order. Wirings 21-28 connecting the input nodes I1-I4 and the output nodes O1-O4 to the respective nodes between the capacitors and resistors are adjusted to be equal in the wiring length. However, in the layout as mentioned above, there is no need to meander considerably the wirings 21-28. Therefore, the layout of components composing a passive polyphase filter will have a plain and simple shape.

Figure 15:
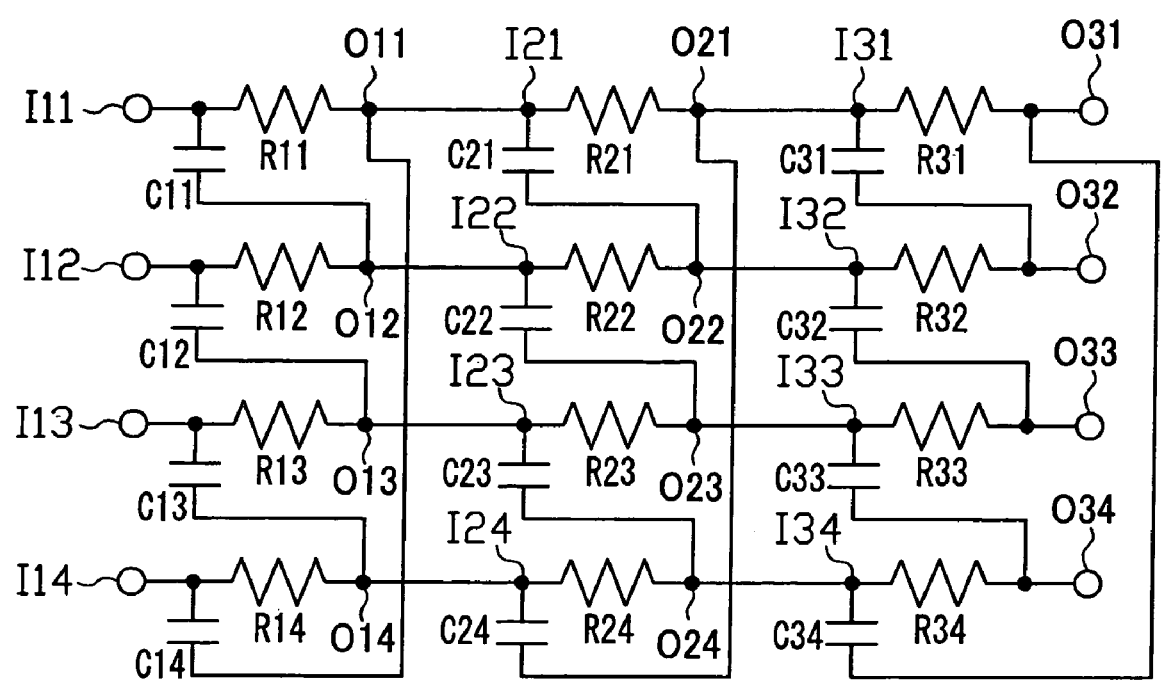
FIG. 15 is a circuit diagram of a 3-stage 4-phase input passive polyphase filter.
Figure 23:
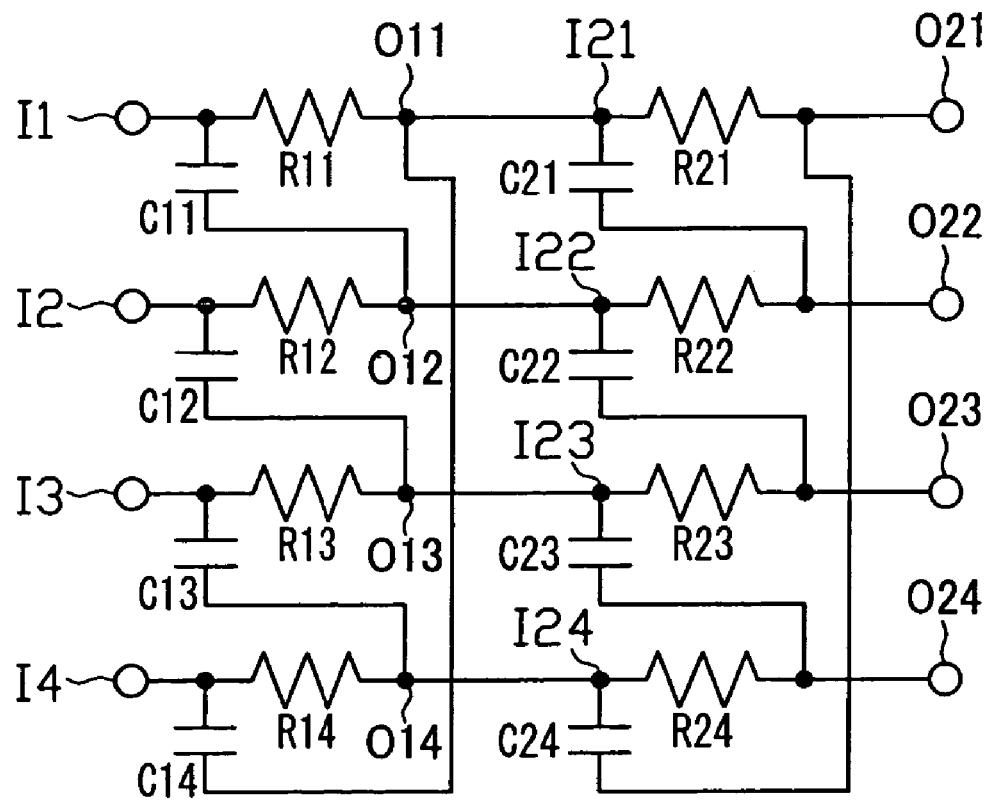
FIG. 23 is a circuit diagram of a 2-stage 4-phase input passive polyphase filter.

FIG. 15 is a circuit diagram of a 3-stage 4-phase input passive polyphase filter. This passive polyphase filter is configured on the basis of the 2-stage 4-phase input passive polyphase filter as shown in FIG. 23, to which a third stage passive polyphase filter is added, and the 3-phase passive polyphase filter includes resistors R31-R34, capacitors C31-C34, input nodes I31-I34, and output nodes O31-O34. The output nodes O21-O24 of the second stage are connected respectively to corresponding input nodes I31-I34 of the third stage.

Figure 16:
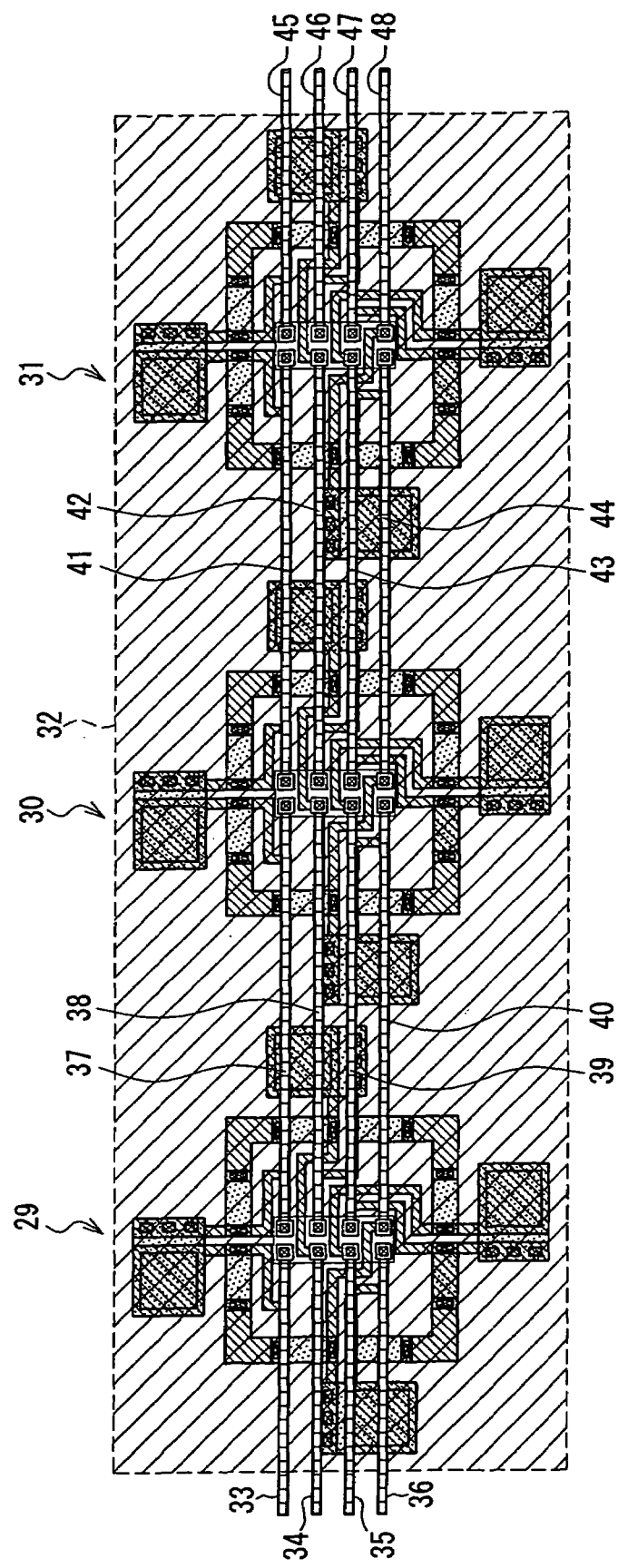
FIG. 16 is a plan view showing a layout of the 3-stage 4-phase input passive polyphase filter according to the fourth embodiment.

FIG. 16 is a plan view showing an example of this passive polyphase filter in which the respective components are arranged in accordance with this embodiment as shown in FIG. 14. In FIG. 16, a first stage passive polyphase filter 29, a second stage passive polyphase filter 30 and a third stage passive polyphase filter 31 have configurations respectively similar to that of the passive polyphase filter as shown in FIG. 14.

The resistors and the capacitors composing the respective passive polyphase filters 29-31 are covered with a wiring layer 32 as an upper layer. The wiring layer 32 is formed of a uniform conductive layer. Furthermore, input wirings 33-36 connected respectively to the input nodes of the first stage passive polyphase filter 29, inter-stage wirings 37-40 and inter-stage wirings 41-44 for respectively connecting the output nodes to the corresponding input nodes, and output wirings 45-48 connected to the output nodes of the third stage passive polyphase filter 31 are arranged in an upper layer above the wiring layer 32.

By covering the four resistors and the four capacitors composing the passive polyphase filter with the wiring layer 32 as an upper layer, parasitic capacitors are formed between the wiring layer 32 and the resistors, and between the wiring layer 32 and the capacitors. The thus created parasitic capacitors will have equal capacitance values for the respective resistors and capacitors by ac-grounding the wiring layer 32, and the parasitic capacitors affect equally on the phases between the respective signals. Therefore, differences will not arise in the filter characteristics between the respective signals. Moreover, since the wirings connecting the output nodes of the first stage and the input nodes of the second stage do not cross each other directly, a wiring capacitor as a parasitic element will not be created, and thus differences in the filter characteristics will not arise between the respective phases. Furthermore, even when plural stages of filters are connected, since the length of the wirings from the output of the former stage to the input of the latter stage can be equalized, the parasitic capacitance values for the respective phases can be equalized as well, and thus differences will not arise in the filter characteristics between the phases. Similar effects can be obtained even when the number of the stages is increased further.

Though not shown in FIG. 14, a wiring layer similar to the wiring layer 32 can be provided on the resistors R1-R4 and the capacitor C1-C4 in FIG. 14. In the wiring above the wiring layer 32, wirings from the exterior to the input nodes I1-I4 and the output nodes O1-O4 are arranged.

As mentioned above, the passive polyphase filter according to the fourth embodiment has a feature that it is configured by arranging four resistors in a region surrounding input nodes and output nodes, arranging four capacitors in a region surrounding the four resistors, and covering the four resistors and four capacitors with a wiring layer as an upper layer. Thereby, the layout of the components can be simplified, and the thus obtained passive polyphase filter is excellent, and influences on the characteristics by the parasitic element caused by the layout will be equalized. The effect of suppressing the complication of the layout of the components and the wiring is improved further, especially in a configuration with plural stages as shown in FIG. 16.

In the configuration of plural stages as shown in FIG. 16, the explanation is based on an example where plural stages of filters having the same resistors and capacitors are connected, but the resistors and capacitors can be varied among the stages in accordance with the required characteristics.

In this embodiment, a 3-layer wiring was used. For reducing the parasitic capacitors with respect to a resistor-forming layer and a capacitor-forming layer, the wiring for the upper layer can be provided as a multilayer wiring.

FIFTH EMBODIMENT

Figure 17:
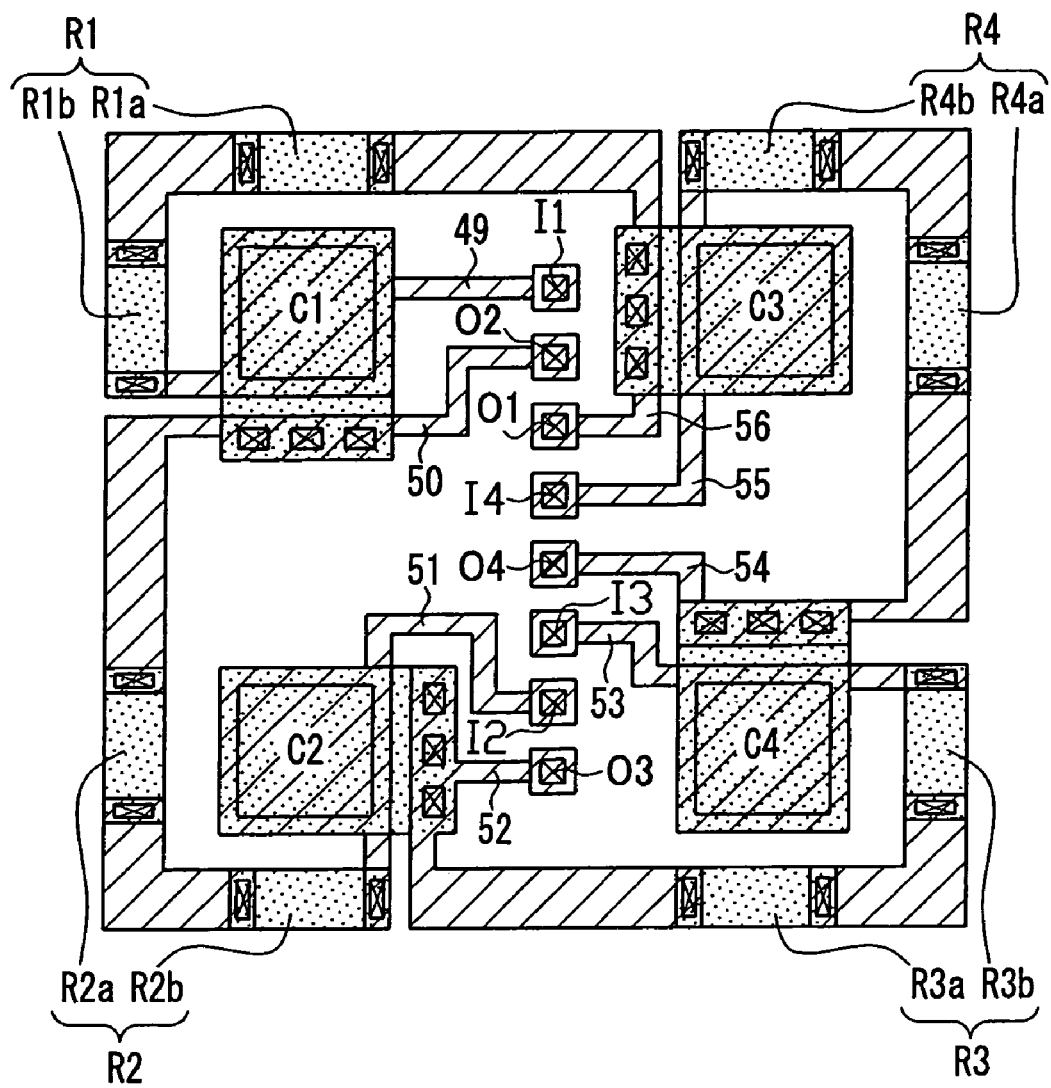
FIG. 17 is a plan view showing a layout of a 4-phase input passive polyphase filter according to a fifth embodiment of the present invention.
Figure 19:
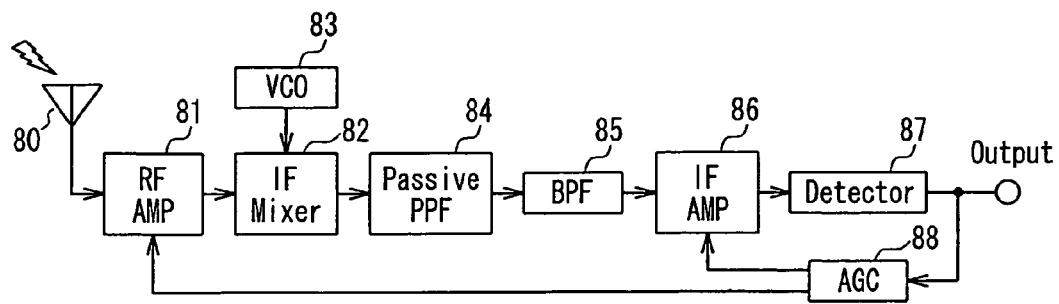
FIG. 19 is a circuit diagram of a receiver according to a sixth embodiment.

FIG. 17 is a plan view showing a layout of a passive polyphase filter according to a fifth embodiment. This layout is an example of a 4-phase input passive polyphase filter having the circuit structure as shown in FIG. 20. Components identical to those in the fourth embodiment as shown in FIG. 19 are assigned with the identical reference numerals for explanation.

Input nodes I1-I4 and output nodes O1-O4 are arranged in line collectively in the central region. The capacitors C1-C4 are arranged counterclockwise in a region surrounding the input nodes I1-I4 and the output nodes O1-O4. The resistors R1-R4 are arranged counterclockwise in a region surrounding the capacitors C1-C4.

Each of the resistors R1-R4 is divided into two parts, so that the resistors are formed of partial resistors R1$a$R1$b$,partial resistors R2$a$,R2$b$, partial resistors R3$a$, R3$b$,and partial resistors R4$a$,R4$b$. The partial resistors R1$a$, R1$b$ forming the resistor R1 are arranged along directions perpendicular to each other. The remaining partial resistors forming the resistors R2-R4 are arranged in the same manner.

The wirings 49-56 connecting the input nodes I1-I4 and the output nodes O1-O4 to the nodes of the resistors R1-R4 and the capacitors C1-C4 are adjusted to be substantially equal in the length of the wirings. However, there is no need to meander considerably the wirings 49-56 in the layout in this embodiment. Therefore, the layout including the components composing the passive polyphase filter will have a fairly plain and simple shape.

Figure 18:
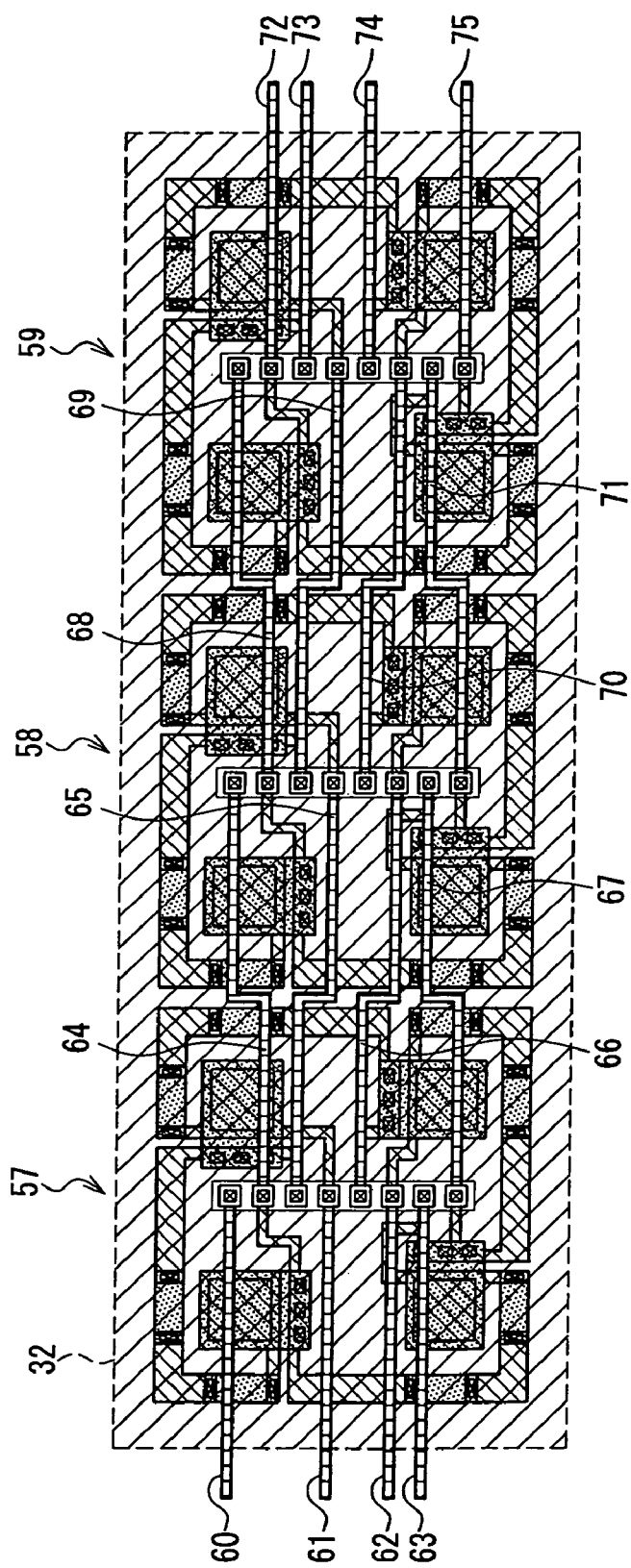
FIG. 18 is a plan view showing a layout of a 3-stage 4-phase input passive polyphase filter according to the fifth embodiment.

Furthermore, FIG. 18 shows an example of the 3-stage 4-phase input passive polyphase filter as shown on FIG. 15, which includes components arranged in accordance with the embodiment as shown in FIG. 17. In FIG. 18, a first stage passive polyphase filter 57, a second stage passive polyphase filter 58, and a third stage passive polyphase filter 59 have configurations respectively similar to that of the passive polyphase filter as shown in FIG. 17.

The resistors and the capacitors composing the respective passive polyphase filters 57-59 are covered with a wiring layer 32 as an upper layer formed of a uniform conductive layer. Furthermore, input wirings 60-63 connected respectively to the input nodes of the first stage passive polyphase filter 57, inter-stage wirings 64-67 and inter-stage wirings 68-71 respectively for connecting the output nodes to the corresponding input nodes, and output wirings 72-75 connected to the output nodes of the third stage passive polyphase filter 59 are arranged on the wiring layer 32.

By covering the four resistors and the four capacitors composing the passive polyphase filter with the wiring layer 32 as an upper layer, parasitic capacitors are formed between the wiring layer 32 and the resistors, and between the wiring layer 32 and the capacitors. The thus created parasitic capacitors will have equal capacitance values for the respective resistors and capacitors by ac-grounding the wiring layer 32, and the parasitic capacitors act equally on the phases between the respective signals. Therefore, differences will not arise in the filter characteristics between the respective signals. Moreover, since the wirings connecting the output nodes of the first stage and the input nodes of the second stage do not cross each other directly, a wiring capacitor as a parasitic element will not be created, and thus differences in the filter characteristics will not arise between the respective phases. Furthermore, even when plural stages of filters are connected, since the length of the wirings from the output of the former stage to the input of the latter stage can be equalized, the parasitic capacitance values for the respective phases can be equalized as well, and thus differences will not arise in the filter characteristics between the phases. Similar effects can be obtained even when the number of the stages is increased further.

As mentioned above, the passive polyphase filter according to the fifth embodiment has a feature that it is configured by arranging four capacitors in a region surrounding input nodes and output nodes, arranging four resistors in a region surrounding the four capacitors, and covering the four resistors and four capacitors with a wiring layer as an upper layer. Thereby, the layout of the components can be simplified, and the thus obtained passive polyphase filter is excellent, and influences on the characteristics by the parasitic element caused by the layout will be equalized. The effect of suppressing the complication of the layout of the components and the wiring is improved further, especially in a configuration with plural stages.

In the configuration of plural stages as shown in FIG. 18, the explanation is based on an example where plural stages of filters having the same resistors and capacitors are connected, but the resistors and capacitors can be varied among the stages in accordance with the required characteristics.

In this embodiment, a 3-layer wiring was used. For reducing the parasitic capacitors with respect to a resistor-forming layer and a capacitor-forming layer, the wiring for the upper layer can be provided as a multilayer wiring.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

SIXTH EMBODIMENT

FIG. 19 shows a receiver circuit of Embodiment 6 of the present invention. An RF input signal received by an antenna 80 is amplified by a RF amplifier 81, and then supplied to an IF (Intermediate frequency) mixer 82. In the IF mixer 82, the RF input signal is mixed with a local signal generated by a VCO (Voltage controlled oscillator) 83, so as to be converted into polyphase intermediate frequency signals. The polyphase intermediate frequency signals are supplied to a passive polyphase filter 84.

The output of the passive polyphase filter 84 is supplied to a band-pass filter 85 to select only a desired IF signal. The output of the band-pass filter 6 is amplified by an IF amplifier 86 and then converted into a baseband signal by a detector 87. The output of the detector 87 is supplied to an AGC 88, and a control voltage is supplied from the AGC 9 to the RF amplifier 81 and the IF amplifier 86, so that their gains are controlled to maintain the signal level constant based on the control voltage.

What is claimed is:

1. A passive polyphase filter comprising input nodes of m in number for inputting m-phase signals, resistors of m in number, capacitors of m in number, and output nodes of m in number for outputting m-phase signals, formed on a same board of an integrated circuit where m denotes an integer not less than 3, the resistors and the capacitors being connected alternately in a loop, the input nodes and the output nodes being connected alternately to the respective nodes between the resistors and the capacitors sequentially, wherein each of the resistors of m in number is composed of a group of partial resistors of at least (m-1) in number, where the partial resistors in (m-1) groups among the groups of m in number are collected for the respective groups and arranged in the same attitude, and partial resistors of the remaining one group are distributed into the other groups and arranged in the same arrangement and the same attitude as the partial resistors of each of the other groups, and regions of the thus collected groups are arranged in one direction.

2. The passive polyphase filter according to claim 1, wherein m=4.

3. The passive polyphase filter according to claim 1, wherein the capacitors of m in number, the input nodes of m in number and the output nodes of m in number are arranged in parallel to the arrangement directions of the respective groups of the partial resistors in line with the respective groups of the partial resistors.

4. The passive polyphase filter according to claim 3, wherein the capacitors of m in number are arranged adjacent to the respective groups of the partial resistors, the input nodes of m in number are arranged in one side of an outer region with respect to a region including the respective groups of the partial resistors and the capacitors of m in number, and the output nodes of m in number are arranged in the other side of the outer region.

5. The passive polyphase filter according to claim 4, wherein the partial resistors in the respective groups are arranged with the sides being adjacent to each other in directions perpendicular to arrangement directions of the respective groups.

6. The passive polyphase filter according to claim 5, wherein the capacitors and either the input nodes or output nodes are connected by wirings traversing the groups of the partial resistors.

7. A passive polyphase filter comprising plural stages of the passive polyphase filters according to claim 1, wherein the input nodes of the passive polyphase filter of the former stage are connected respectively to the corresponding output nodes of the passive polyphase filter of the latter stage.

8. An integrated circuit comprising the passive polyphase filter according to claim 1.

9. A receiver comprising the integrated circuit according to claim 8.

10. A passive polyphase filter comprising four resistors, four capacitors, four input nodes for inputting 4-phase signals and four output nodes for outputting 4-phase signals, formed on a same board of an integrated circuit, the resistors and the capacitors being connected alternately in a loop, and the input nodes and the output nodes being connected alternately to respective nodes between the resistors and the capacitors sequentially, wherein the input nodes and the output nodes are arranged collectively in a central region, the four resistors are arranged in a region surrounding the input nodes and the output nodes, the four capacitors are arranged in a region surrounding the four resistors, and the four resistors and the four capacitors are covered with a wiring layer as an upper layer formed of a uniform conductive layer.

11. The passive polyphase filter according to claim 10, wherein each of the four resistors is divided into two parts, and the divided partial resistors are arranged respectively along directions perpendicular to each other.

12. A passive polyphase filter comprising plural stages of the passive polyphase filters according to claim 10, wherein the input nodes of the passive polyphase filter of the former stage are connected respectively to the corresponding output nodes of the passive polyphase filter of the latter stage.

13. An integrated circuit comprising the passive polyphase filter according to claim 10.

14. A receiver comprising the integrated circuit according to claim 13.

15. A passive polyphase filter comprising four resistors, four capacitors, four input nodes for inputting 4-phase signals and four output nodes for outputting 4-phase signals, formed on a same board of an integrated circuit, the resistors and the capacitors being connected alternately in a loop, and the input nodes and the output nodes being connected alternately to respective nodes between the resistors and the capacitors sequentially, wherein the input nodes and the output nodes are arranged collectively in the central region, the four capacitors are arranged in a region surrounding the input nodes and the output nodes, the four resistors are arranged in a region surrounding the four capacitors, and the four resistors and the four capacitors are covered with a wiring layer as an upper layer formed of a uniform conductive layer.

16. The passive polyphase filter according to claim 15, wherein each of the four resistors is divided into two parts, and the divided partial resistors are arranged respectively along directions perpendicular to each other.

17. A passive polyphase filter comprising a plural stages of the passive polyphase filters according to claim 15, wherein the input nodes of the passive polyphase filter in the former stage are connected respectively to the corresponding output nodes of the passive polyphase filter in the latter stage.

18. An integrated circuit comprising the passive polyphase filter according to claim 15.

19. A receiver comprising the integrated circuit according to claim 18.

* * * * *